(12) United States Patent
Kanagawa (10) Patent No.: US 10,084,458 B1
(45) Date of Patent: Sep. 25, 2018

(54) FREQUENCY DIVIDER CIRCUIT (71) Applicant: TOSHIBA MEMORY CORPORATION, Minato-ku, Tokyo (JP)

(72) Inventor: Naoaki Kanagawa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,521

(22) Filed: Sep. 12, 2017

(30) Foreign Application Priority Data

Mar. 24, 2017 (JP) .................................. 2017-059255

(51) Int. Cl.
| | | |
|---|---|---|
| *H03K 23/00* | (2006.01) |
| *H03K 21/00* | (2006.01) |
| *H03K 21/10* | (2006.01) |
| *H03K 3/356* | (2006.01) |
| *G11C 16/30* | (2006.01) |
| *G11C 16/32* | (2006.01) |
| *G11C 16/08* | (2006.01) |
| *H03K 19/21* | (2006.01) |

(52) U.S. Cl.
CPC ............. *H03K 21/10* (2013.01); *G11C 16/08* (2013.01); *G11C 16/30* (2013.01); *G11C 16/32* (2013.01); *H03K 3/356* (2013.01); *H03K 19/21* (2013.01)

(58) Field of Classification Search
CPC ........ H03K 21/10; H03K 3/356; H03K 19/21; G11C 16/08; G11C 16/32; G11C 16/30
See application file for complete search history.

(56) References Cited

U.S. PATENT DOCUMENTS

| | | | | |
|---|---|---|---|---|
| 5,390,223 A * | 2/1995 | Lindholm | ............ | H03K 23/505 327/115 |
| 6,469,549 B2 * | 10/2002 | Carson | ....................... | G06F 7/68 327/115 |
| 6,707,326 B1 * | 3/2004 | Magoon | .................... | G06F 7/68 327/115 |
| 7,061,284 B2 * | 6/2006 | Boerstler | ................... | G06F 7/58 327/115 |
| 7,579,883 B2 * | 8/2009 | Dekate | ................. | H03K 23/505 327/117 |

(Continued)

FOREIGN PATENT DOCUMENTS

| | | |
|---|---|---|
| JP | 05048432 A | 2/1993 |
| JP | 06061843 A | 3/1994 |
| JP | 2002344308 A | 11/2002 |

*Primary Examiner* — Kenneth B Wells
(74) *Attorney, Agent, or Firm* — Holtz, Holtz & Volek PC (57) ABSTRACT

According to one embodiment, a frequency divider circuit includes a 1st flip-flop including a 1st terminal to which a clock signal is input, and including a 2nd terminal to which a 1st signal is input; a 2nd flip-flop including a 1st terminal to which the clock signal is input, and including a 2nd terminal to which a 2nd signal is input, the 2nd signal being output from the 1st flip-flop; a 3rd flip-flop including a 1st terminal to which the clock signal is input, and including a 2nd terminal to which a 3rd signal is input, the 3rd signal being output from the 2nd flip-flop; and an exclusive OR gate including a 1st terminal to which the 4th signal is input, and including a 2nd terminal to which a 5th signal is input, the 5th signal being output from the 2nd flip-flop.

18 Claims, 9 Drawing Sheets (56) References Cited

U.S. PATENT DOCUMENTS

| | | | |
|---|---|---|---|
| 7,796,721 B2* | 9/2010 | Fattaruso | H03K 3/356113 377/47 |
| 7,808,287 B2* | 10/2010 | Miller | G06F 1/3203 327/115 |
| 7,881,422 B1 | 2/2011 | Chiang | |
| 8,406,371 B1* | 3/2013 | Barale | H03K 23/662 377/47 |
| 8,643,408 B2* | 2/2014 | Yuan | H03K 3/0375 327/115 |
| 8,704,557 B2* | 4/2014 | Malmcrona | H03K 23/425 327/114 |
| 9,065,449 B2* | 6/2015 | Atesoglu | H03K 5/1565 |
| 9,935,639 B2* | 4/2018 | Zhai | H03L 7/183 |
| 2002/0036317 A1 | 3/2002 | Matsui et al. | |
| 2002/0171458 A1 | 11/2002 | Hirano | |
| 2009/0267128 A1 | 10/2009 | Maejima | |
| 2009/0268522 A1 | 10/2009 | Maejima | |
| 2009/0316494 A1 | 12/2009 | Uehara et al. | |
| 2010/0034023 A1 | 2/2010 | Shingu et al. | |
| 2010/0207195 A1 | 8/2010 | Fukuzumi et al. | |
| 2011/0284946 A1 | 11/2011 | Kiyotoshi | |
| 2012/0201083 A1 | 8/2012 | Fujiu | |
| 2013/0141971 A1 | 6/2013 | Hosono | |

\* cited by examiner

FREQUENCY DIVIDER CIRCUIT

CROSS-REFERENCE TO RELATED APPLICATIONS

This application is based upon and claims the benefit of priority from prior Japanese Patent Application No. 2017-059255, filed Mar. 24, 2017; the entire contents of which are incorporated herein by reference.

FIELD

Embodiments described herein relate generally to a frequency divider circuit.

BACKGROUND

With an increase in speed of operation of semiconductor memory devices, there has been a demand for a frequency divider circuit which operates at high speed.

DETAILED DESCRIPTION

In general, according to one embodiment, a frequency divider circuit includes a first flip-flop including a first input terminal to which a clock signal is input, and including a second input terminal to which a first signal is input; a second flip-flop including a first input terminal to which the clock signal is input, and including a second input terminal to which a second signal is input, the second signal being output from the first flip-flop; a third flip-flop including a first input terminal to which the clock signal is input, and including a second input terminal to which a third signal is input, the third signal being output from the second flip-flop; an inverter configured to generate the first signal, based on a fourth signal which is output from the third flip-flop; and an exclusive OR gate including a first input terminal to which the fourth signal is input, and including a second input terminal to which a fifth signal is input, the fifth signal being output from the second flip-flop.

The details of an embodiment will be described hereinafter with reference to the accompanying drawings. In the description, common parts are denoted by like reference numerals throughout the drawings.

<1> Embodiment

A frequency divider circuit according to the embodiment will be described.

<1-1> Configuration

<1-1-1> Configuration of Memory System

The configuration of a memory system including the frequency divider circuit according to the embodiment will be described with reference to FIG. 1.

Figure 1:
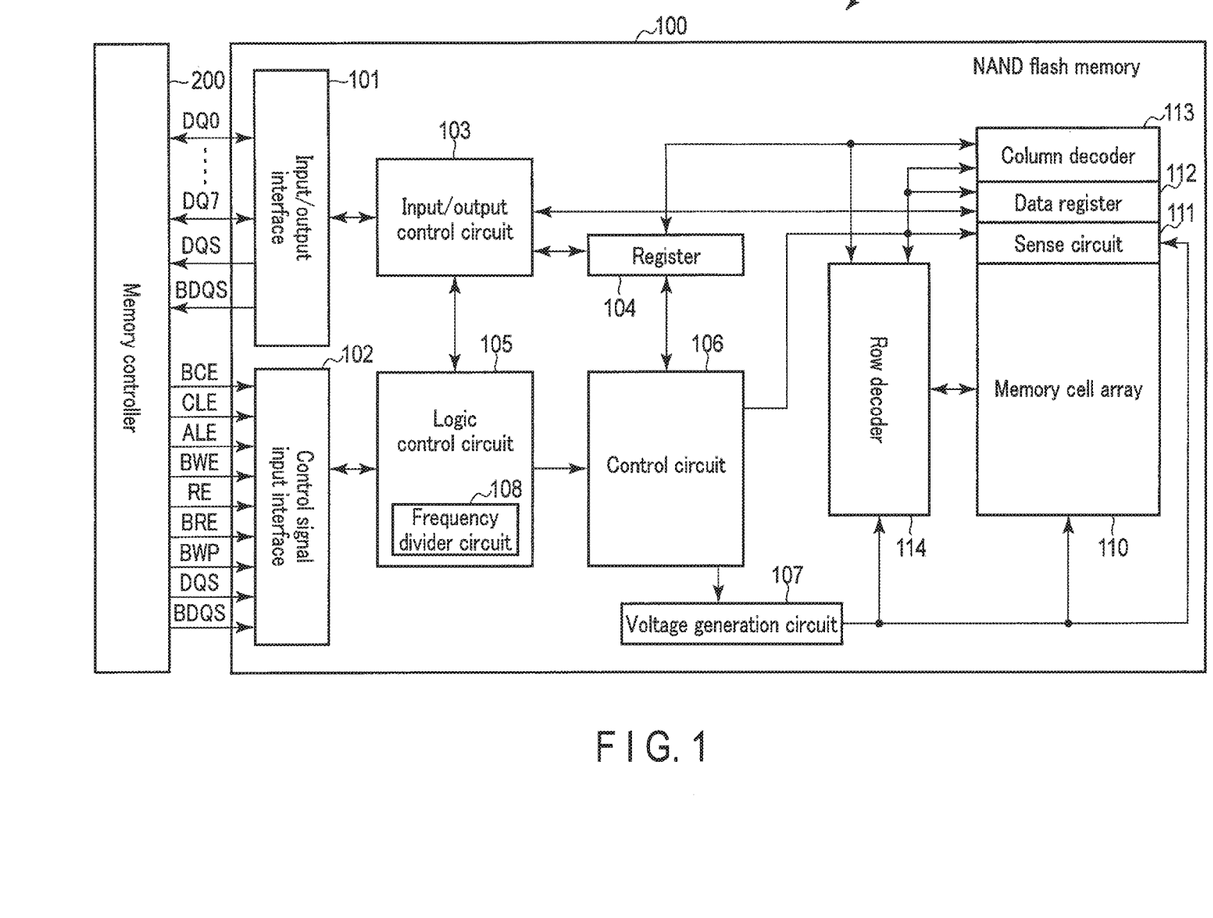
FIG. 1 is a block diagram illustrating a semiconductor memory device including a frequency divider circuit according to an embodiment.

As illustrated in FIG. 1, the memory system 1 includes a NAND flash memory (semiconductor memory device) 100 and a memory controller 200. The NAND flash memory 100 and memory controller 200 may constitute, for example, a single semiconductor device by the combination thereof. Examples of this single semiconductor device include a memory card such as an SD™ card, and an SSD (solid state drive). The memory system 1 may be configured to further include a host device (not shown).

<1-1-2> Memory Controller

The memory controller 200 outputs a command or the like, which is necessary for the operation of the NAND flash memory 100, to the NAND flash memory 100. By outputting the command to the NAND flash memory 100, the memory controller 200 executes data read from the NAND flash memory 100, data write to the NAND flash memory 100, or data erase in the NAND flash memory 100.

<1-1-3> NAND Flash Memory

Referring to FIG. 1, the NAND flash memory 100 according to the embodiment will be described.

The memory controller 200 and NAND flash memory 100 are connected via an input/output interface 101 and a control signal input interface 102.

The input/output interface 101 generates data strobe signals DQS and BDQS (complementary signal of DQS) in accordance with signals which are supplied from an input/output control circuit 103. When outputting data from data input/output lines (DQ0 to DQ7), the input/output interface 101 outputs the data strobe signals DQS and BDQS. In addition, the memory controller 200 receives data from the data input/output lines DQ0 to DQ7 in accordance with the timing of the data strobe signals DQS and BDQS.

Besides, the input/output interface 101 includes, for example, command input terminals, and address input terminals.

The control signal input interface 102 receives, from the memory controller 200, a chip enable signal BCE, a command latch enable signal CLE, an address latch enable signal ALE, a write enable signal BWE, read enable signals RE and BRE (complementary signal of RE), a write protect signal BWP, and data strobe signals DQS and BDQS.

The chip enable signal BCE is used as a select signal of the NAND flash memory 100.

The command latch enable signal CLE is a signal which is used when an operation command is taken in a register 104.

The address latch enable signal ALE is a signal which is used when address information or input data is taken in the register 104.

The write enable signal BWE is a signal for taking in the NAND flash memory 100 a command, an address and data on the input/output interface 101.

The read enable signal RE is a signal which is used when data is serially output from the input/output interface 101.

The write protect signal BWP is used in order to protect data from unexpectable erase or write, when an input signal is uncertain, such as when the NAND flash memory 100 is powered on or powered off.

Although not illustrated in FIG. 1, an R/B terminal for indicating an internal operation state of the NAND flash memory 100, and a Vcc/Vss/Vccq/Vssq terminals, etc. for power supply are also provided in the NAND flash memory 100.

The input/output control circuit 103 outputs data, which is read out from a memory cell array 110, to the memory controller 200 via the input/output interface 101. The input/output control circuit 103 receives, via the control signal input interface 102 and a logic control circuit 105, various commands of write, read, erase and status read, addresses, and write data.

The register 104 outputs a command, which is input from the input/output control circuit 103, to a control circuit 106.

The register 104 latches, for example, an address which is supplied from the memory controller 200. In addition, the register 104 converts the latched address to internal physical addresses (column address and row address). Further, the register 104 supplies a column address to a column decoder 113, and supplies a row address to a row decoder 114.

The register 104 notifies various states of the inside of the NAND flash memory 100 to the outside. The register 104 includes a ready/busy register (not shown) which stores data indicating whether the NAND flash memory 100 is in a ready state or a busy state, and a write status register (not shown) which stores data indicating pass/fail of write.

The logic control circuit 105 supplies control signals, which are input via the control signal input interface 102, to the input/output control circuit 103 and control circuit 106.

The control circuit 106 controls a voltage generation circuit 107, a sense circuit 111, a data register 112, the column decoder 113, the row decoder 114, and the register 104.

The control circuit 106 operates in accordance with a control signal which is input from the logic control circuit 105, and a command which is input via the register 104. The control circuit 106 supplies desired voltages to the memory cell array 110, sense circuit 111 and row decoder 114 by using the voltage generation circuit 107, at times of data program, data verify, data read and data erase.

In the present embodiment, the input/output control circuit 103, logic control circuit 105 and control circuit 106 have been described with respect to their individual functions. However, the input/output control circuit 103, logic control circuit 105 and control circuit 106 may be realized by the same hardware resources.

A frequency divider circuit 108 is a circuit which frequency-divides a received clock signal by a desired multiple. In this embodiment, the frequency divider circuit 108 is described as a ⅓ frequency division circuit. This clock signal may be the data strobe signal DQS, or may be another internal clock (not shown). Incidentally, in FIG. 1, although the frequency divider circuit 108 is provided in the logic control circuit 105 by way of example, the frequency divider circuit 108 may be provided at any location. The frequency divider circuit 108 will be described later in greater detail.

The memory cell array 110 includes a plurality of bit lines BL, a plurality of word lines WL, and source lines SL. The memory cell array 110 is composed of a plurality of blocks BLK in which electrically rewritable memory cell transistors (also referred to simply as "memory cells") MC are arranged in a matrix. The memory cell transistor MC includes, for example, a multilayer gate including a control gate electrode and a charge accumulation layer (e.g. a floating gate electrode), and stores single-level data or multilevel data by a variation of a threshold of the transistor which is determined by a charge amount injected in the floating gate electrode. In addition, the memory cell transistor MC may have a MONOS (Metal-Oxide-Nitride-Oxide-Silicon) configuration which traps electrons in a nitride film.

The memory cell array 110 may have other configurations. Specifically, the configuration of the memory cell array 110 is disclosed, for example, in U.S. patent application Ser. No. 12/407,403 filed Mar. 19, 2009 and entitled "THREE DIMENSIONAL STACKED NONVOLATILE SEMICONDUCTOR MEMORY". In addition, the configuration of the memory cell array 110 is disclosed in U.S. patent application Ser. No. 12/406,524 filed Mar. 18, 2009 and entitled "THREE DIMENSIONAL STACKED NONVOLATILE SEMICONDUCTOR MEMORY", U.S. patent application Ser. No. 12/679,991 filed Mar. 25, 2010 and entitled "NONVOLATILE SEMICONDUCTOR MEMORY DEVICE AND METHOD OF MANUFACTURING THE SAME", U.S. patent application Ser. No. 13/816,799 filed Sep. 22, 2011 and entitled "NONVOLATILE SEMICONDUCTOR MEMORY DEVICE", and U.S. patent application Ser. No. 12/532,030 filed Mar. 23, 2009 and entitled "SEMICONDUCTOR MEMORY AND METHOD FOR MANUFACTURING SAME". The entirety of these patent applications is incorporated in the present specification by reference.

Besides, the configuration of the memory cell array 110 is disclosed, for example, in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration of the memory cell array 110 is disclosed in U.S. patent application Ser. No. 13/451,185 filed Apr. 19, 2012 and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE, U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT, and U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entirety of these patent applications is incorporated in the present specification by reference.

The sense circuit 111 senses data, which was read from the memory cell transistor MC to the bit line, at a data read operation time.

The data register 112 is composed of an SRAM or the like. The data register 112 stores data which was supplied from the memory controller 200, or a verify result detected by the sense circuit 111.

The column decoder 113 decodes a column address signal, and outputs a select signal, which selects any one of the bit lines BL, to the sense circuit 111.

The row decoder 114 decodes a row address signal. In addition, the row decoder 114 selects and drives a word line WL and a select gate line SGD, SGS of the memory cell array 110.

<1-1-4> Frequency Divider Circuit

Figure 2:
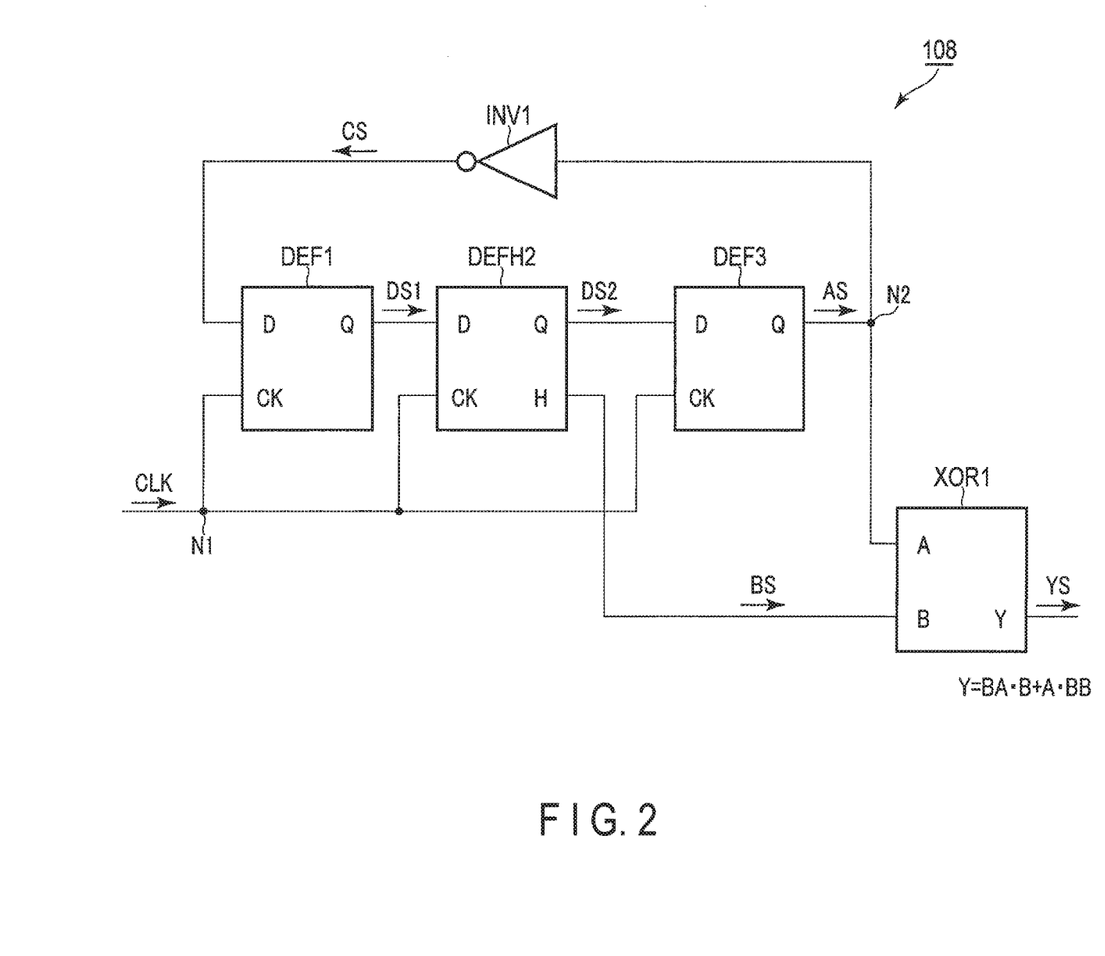
FIG. 2 is a block diagram illustrating the frequency divider circuit according to the embodiment.

The frequency divider circuit 108 will be described with reference to FIG. 2.

The frequency divider circuit 108 includes a first flip-flop (D-flip-flop) DEF1, a second flip-flop (half-latch-equipped D-flip-flop) DEFH2, a third flip-flop (D-flip-flop) DEF3, a first inverter INV1, and an exclusive OR gate XOR1.

A first input terminal CK of the first flip-flop DEF1 is connected to a node N1, and a second input terminal D of the first flip-flop DEF1 is connected to an output terminal of the first inverter INV1.

A first input terminal CK of the second flip-flop DEFH2 is connected to the node N1, and a second input terminal D of the second flip-flop DEFH2 is connected to an output terminal Q of the first flip-flop DEF1.

A first input terminal CK of the third flip-flop DEF3 is connected to the node N1, and a second input terminal D of the third flip-flop DEF3 is connected to a second output terminal Q of the second flip-flop DEFH2.

An output terminal Q of the third flip-flop DEF3 is connected to an input terminal of the first inverter INV1 via a node N2. The first inverter INV1 inverts an input signal and outputs an inverted signal to the second input terminal D of the first flip-flop DEF1.

The first flip-flop DEF1, second flip-flop DEFH2 and third flip-flop DEF3 store data, based on input signals.

A first input terminal A of the exclusive OR gate XOR1 is connected to the node N2. A second input terminal B of the exclusive OR gate XOR1 is connected to a first output terminal H of the second flip-flop DEFH2. The exclusive OR gate XOR1 calculates and outputs BA·B+A*BB=Y with respect to the inputs A and B. BA is an inverted signal of A, and BB is an inverted signal of B.

<1-1-5> Second Flip-Flop DEFH2

Figure 3:
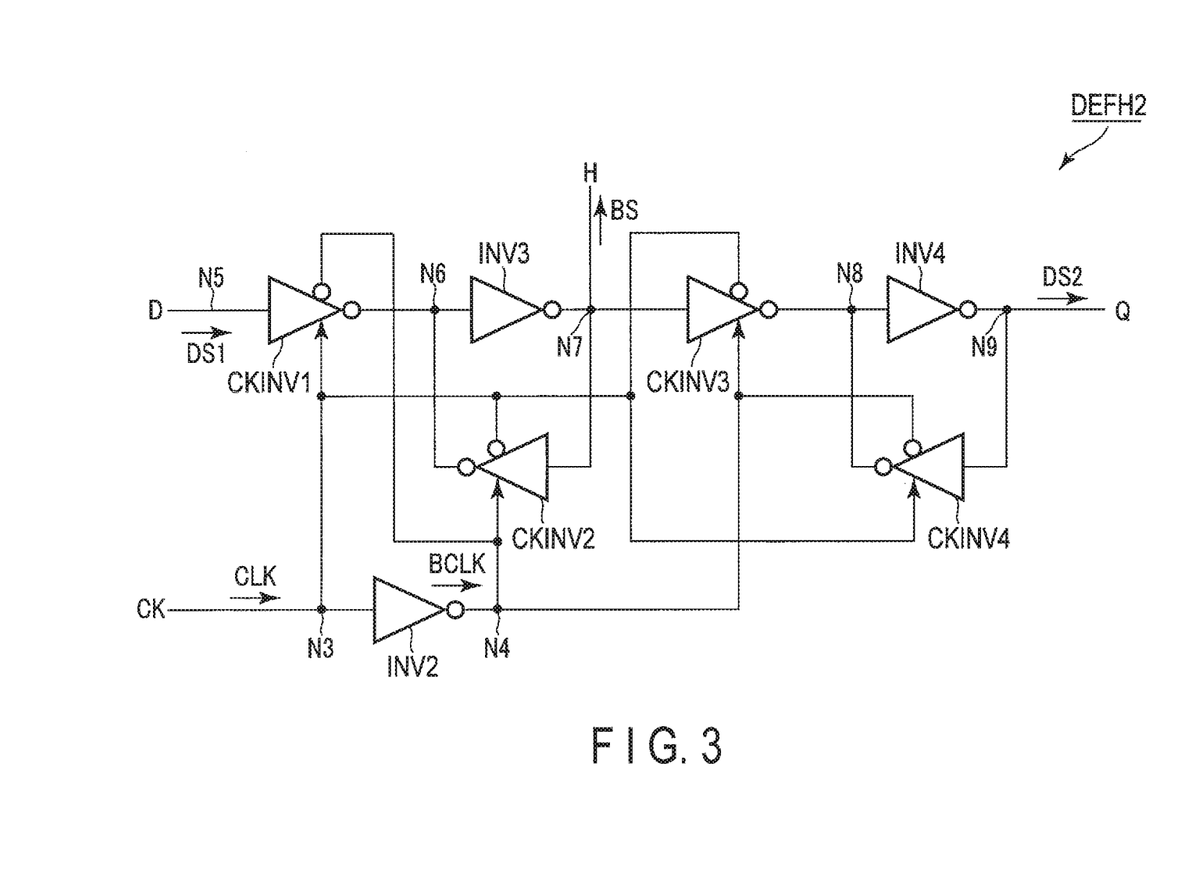
FIG. 3 is a circuit diagram illustrating a second flip-flop of the frequency divider circuit according to the embodiment.

Next, the second flip-flop DEFH2 will be described. As illustrated in FIG. 3, the second flip-flop DEFH2 includes a second inverter INV2, a third inverter INV3, a fourth inverter INV4, a first clocked inverter CKINV1, a second clocked inverter CKINV2, a third clocked inverter CKINV3, and a fourth clocked inverter CKINV4.

An input terminal of the second inverter INV2 is connected to the first input terminal CK of the second flip-flop DEFH2 via a node N3. The second inverter INV2 inverts an input signal and outputs an inverted signal to a node N4.

An input terminal of the first clocked inverter CKINV1 is connected to the second terminal D of the second flip-flop DEFH2 via a node N5. A first clock input terminal of the first clocked inverter CKINV1 is connected to the node N4. A second clock input terminal of the first clocked inverter CKINV1 is connected to the node N3. Based on a clock signal CLK and an inverted clock signal BCLK, the first clocked inverter CKINV1 inverts an input signal and outputs an inverted signal to a node N6.

An input terminal of the third inverter INV3 is connected to the node N6, and the third inverter INV3 inverts an input signal and outputs an inverted signal to a node N7.

An input terminal of the second clocked inverter CKINV2 is connected to the node N7. A first clock input terminal of the second clocked inverter CKINV2 is connected to the node N3. A second clock input terminal of the second clocked inverter CKINV2 is connected to the node N4. Based on the clock signal CLK and inverted clock signal BCLK, the second clocked inverter CKINV2 inverts an input signal and outputs an inverted signal to the node N6.

The first clocked inverter CKINV1, third inverter INV3 and second clocked inverter CKINV2 function as a master latch.

The potential of the node N7 is output as a signal BS from the first output terminal H. In this example, the node N7 is described also as a half-latch portion or the like. In addition, the signal BS is described also as a half-latch output or the like.

An input terminal of the third clocked inverter CKINV3 is connected to the node N7. A first clock input terminal of the third clocked inverter CKINV3 is connected to the node N3. A second clock input terminal of the third clocked inverter CKINV3 is connected to the node N4. Based on the clock signal CLK and inverted clock signal BCLK, the third clocked inverter CKINV3 inverts an input signal and outputs an inverted signal to a node N8.

An input terminal of the fourth inverter INV4 is connected to the node N8, and the fourth inverter INV4 inverts an input signal and outputs an inverted signal to a node N9.

An input terminal of the fourth clocked inverter CKINV4 is connected to the node N9. A first clock input terminal of the fourth clocked inverter CKINV4 is connected to the node N4. A second clock input terminal of the fourth clocked inverter CKINV4 is connected to the node N3. Based on the clock signal CLK and inverted clock signal BCLK, the fourth clocked inverter CKINV4 inverts an input signal and outputs an inverted signal to the node N8.

The potential of the node N9 is output as a signal DS2 from the second output terminal Q.

The third clocked inverter CKINV3, fourth inverter INV4 and fourth clocked inverter CKINV4 function as a slave latch.

<1-1-5-1> First Clocked Inverter CKINV1

Next, referring to FIG. 4, a circuit diagram of the first clocked inverter CKINV1 will be described.

Figure 4:
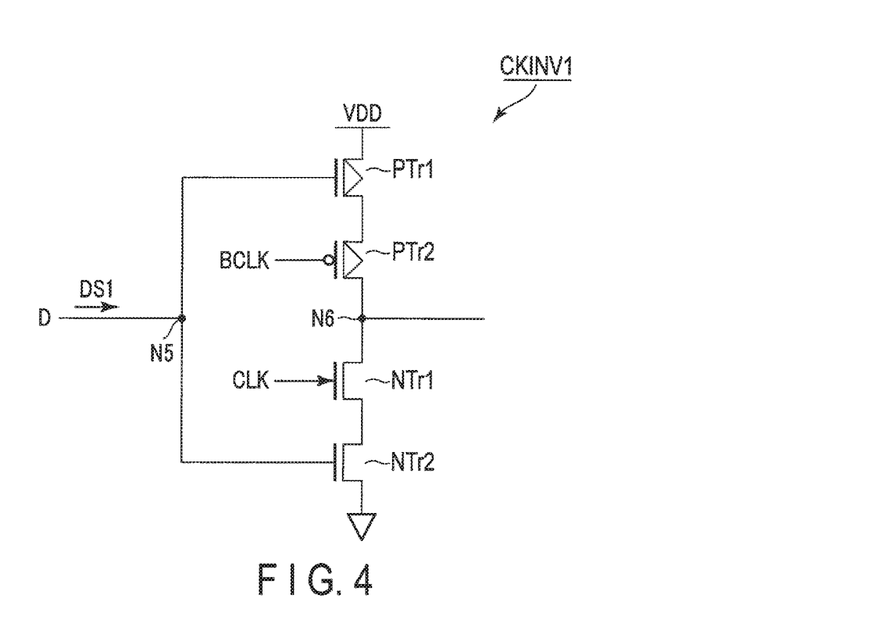
FIG. 4 is a circuit diagram illustrating a first clocked inverter of the frequency divider circuit according to the embodiment.

As illustrated in FIG. 4, the first clocked inverter CKINV1 includes PMOS (P-type metal-oxide-semiconductor) transistors PTr1 and PTr2, and NMOS (N-type metal-oxide-semiconductor) transistors NTr1 and NTr2.

The PMOS transistor PTr1 supplies a power supply voltage VDD from the source to drain thereof, based on a signal which is input to the gate thereof via the node N5.

The PMOS transistor PTr2 electrically connects its source and drain (node N6), based on the inverted clock signal BCLK.

The NMOS transistor NTr1 electrically connects its drain (node N6) and source, based on the clock signal CLK.

The NMOS transistor NTr2 has its drain grounded via the source, based on the signal which is input to the gate thereof via the node N5.

The first clocked inverter CKINV1 sets the potential of the node N6 at "H" level via the PMOS transistors PTr1 and PTr2, when the signal that is input to the gate via the node N5 is "L (Low)" level (potential) and the inverted clock signal is "L" level. The first clocked inverter CKINV1 sets the potential of the node N6 at "L" level via the NMOS transistors NTr1 and NTr2, when the signal that is input to the gate via the node N5 is "H (High)" (L<H) level and the clock signal is "H" level.

<1-1-5-2> Second Clocked Inverter CKINV2

Next, referring to FIG. 5, a circuit diagram of the second clocked inverter CKINV2 will be described.

Figure 5:
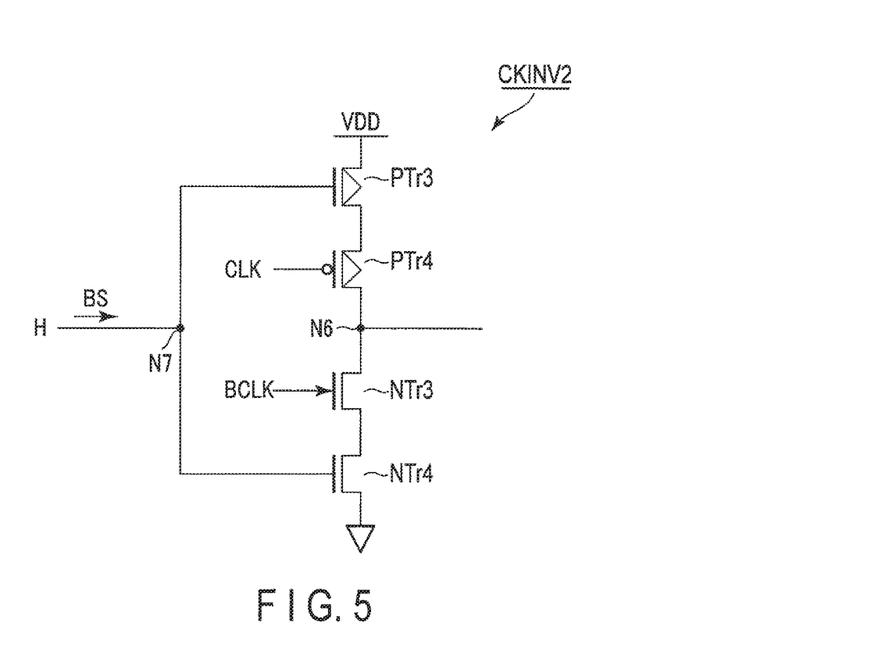
FIG. 5 is a circuit diagram illustrating a second clocked inverter of the frequency divider circuit according to the embodiment.

As illustrated in FIG. 5, the second clocked inverter CKINV2 includes PMOS transistors PTr3 and PTr4, and NMOS transistors NTr3 and NTr4.

The PMOS transistor PTr3 supplies a power supply voltage VDD from the source to drain thereof, based on a signal which is input to the gate thereof via the node N7.

The PMOS transistor PTr4 electrically connects its source and drain (node N6), based on the clock signal CLK.

The NMOS transistor NTr3 electrically connects its drain (node N6) and source, based on the inverted clock signal BCLK.

The NMOS transistor NTr4 has its drain grounded via the source, based on the signal which is input to the gate thereof via the node N7.

The second clocked inverter CKINV2 sets the potential of the node N6 at "H" level via the PMOS transistors PTr3 and PTr4, when the signal that is input to the gate via the node N7 is "L" level and the clock signal is "L" level. The second clocked inverter CKINV2 sets the potential of the node N6 at "L" level via the NMOS transistors NTr3 and NTr4, when the signal that is input to the gate via the node N7 is "H" level and the inverted clock signal is "H" level.

<1-1-5-3> Third Clocked Inverter CKINV3

Next, referring to FIG. 6, a circuit diagram of the third clocked inverter CKINV3 will be described.

Figure 6:
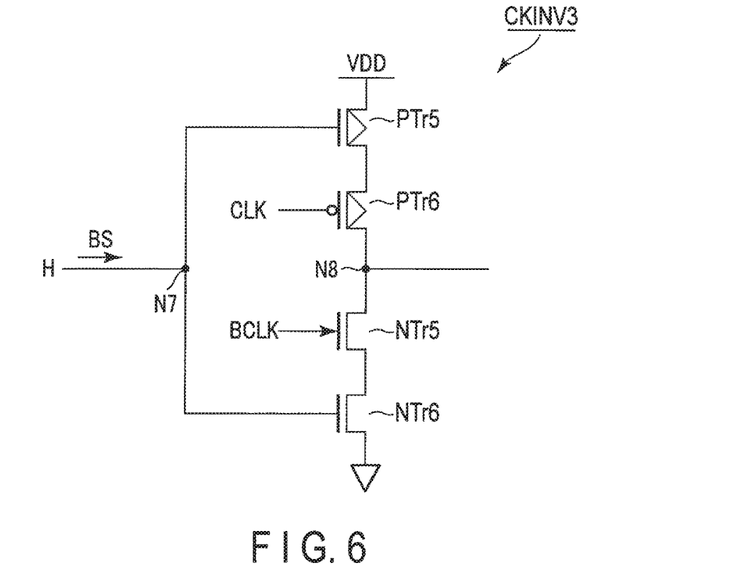
FIG. 6 is a circuit diagram illustrating a third clocked inverter of the frequency divider circuit according to the embodiment.

As illustrated in FIG. 6, the third clocked inverter CKINV3 includes PMOS transistors PTr5 and PTr6, and NMOS transistors NTr5 and NTr6.

The PMOS transistor PTr5 supplies a power supply voltage VDD from the source to drain thereof, based on a signal which is input to the gate thereof via the node N7.

The PMOS transistor PTr6 electrically connects its source and drain (node N8), based on the clock signal CLK.

The NMOS transistor NTr5 electrically connects its drain (node N8) and source, based on the inverted clock signal BCLK.

The NMOS transistor NTr6 has its drain grounded via the source, based on the signal which is input to the gate thereof via the node N7.

The third clocked inverter CKINV3 sets the potential of the node N8 at "H" level via the PMOS transistors PTr5 and PTr6, when the signal that is input to the gate via the node N7 is "L" level and the clock signal is "L" level. The third clocked inverter CKINV3 sets the potential of the node N8 at "L" level via the NMOS transistors NTr5 and NTr6, when the signal that is input to the gate via the node N7 is "H" level and the inverted clock signal is "H" level.

<1-1-5-4> Fourth Clocked Inverter CKINV4

Next, referring to FIG. 7, a circuit diagram of the fourth clocked inverter CKINV4 will be described.

Figure 7:
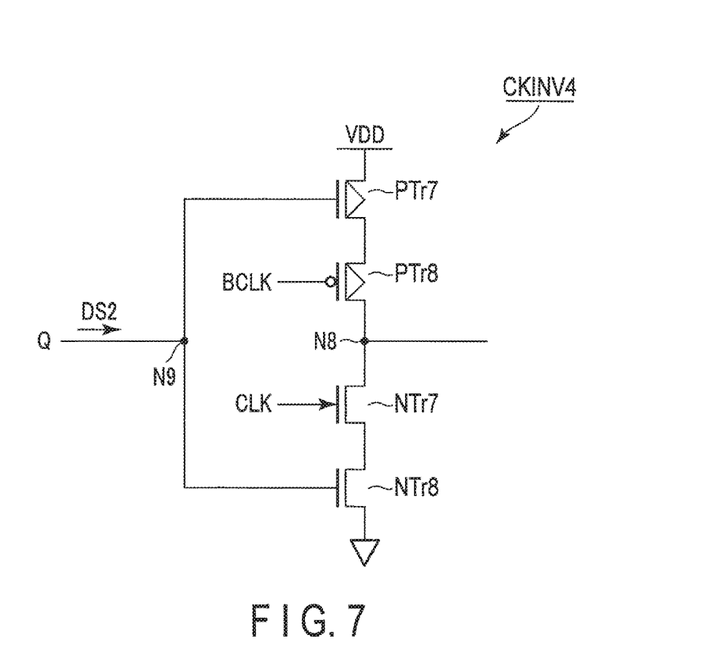
FIG. 7 is a circuit diagram illustrating a fourth clocked inverter of the frequency divider circuit according to the embodiment.

As illustrated in FIG. 7, the fourth clocked inverter CKINV4 includes PMOS transistors PTr7 and PTr8, and NMOS transistors NTr7 and NTr8.

The PMOS transistor PTr7 supplies a power supply voltage VDD from the source to drain thereof, based on a signal which is input to the gate thereof via the node N9.

The PMOS transistor PTr8 electrically connects its source and drain (node N8), based on the inverted clock signal BCLK.

The NMOS transistor NTr7 electrically connects its drain (node N8) and source, based on the clock signal CLK.

The NMOS transistor NTr8 has its drain grounded via the source, based on the signal which is input to the gate thereof via the node N9.

The fourth clocked inverter CKINV4 sets the potential of the node N8 at "H" level via the PMOS transistors PTr7 and PTr8, when the signal that is input to the gate via the node N9 is "L" level and the inverted clock signal is "L" level. The fourth clocked inverter CKINV4 sets the potential of the node N8 at "L" level via the NMOS transistors NTr7 and NTr8, when the signal that is input to the gate via the node N9 is "H" level and the clock signal is "H" level.

In the meantime, the configurations of the first flip-flop DEF1 and third flip-flop DEF3 are substantially the same as the configuration of the second flip-flop DEFH2. The first flip-flop DEF1 and third flip-flop DEF3 are different from the second flip-flop DEFH2 in that neither the first flip-flop DEF1 nor the third flip-flop DEF3 includes the first output terminal H of the second flip-flop DEFH2.

<1-2> Operation

<1-2-1> Operation of the Second Flip-Flop

Next, referring to FIG. 8, the operation of the second flip-flop DEFH2 will be described.

Figure 8:
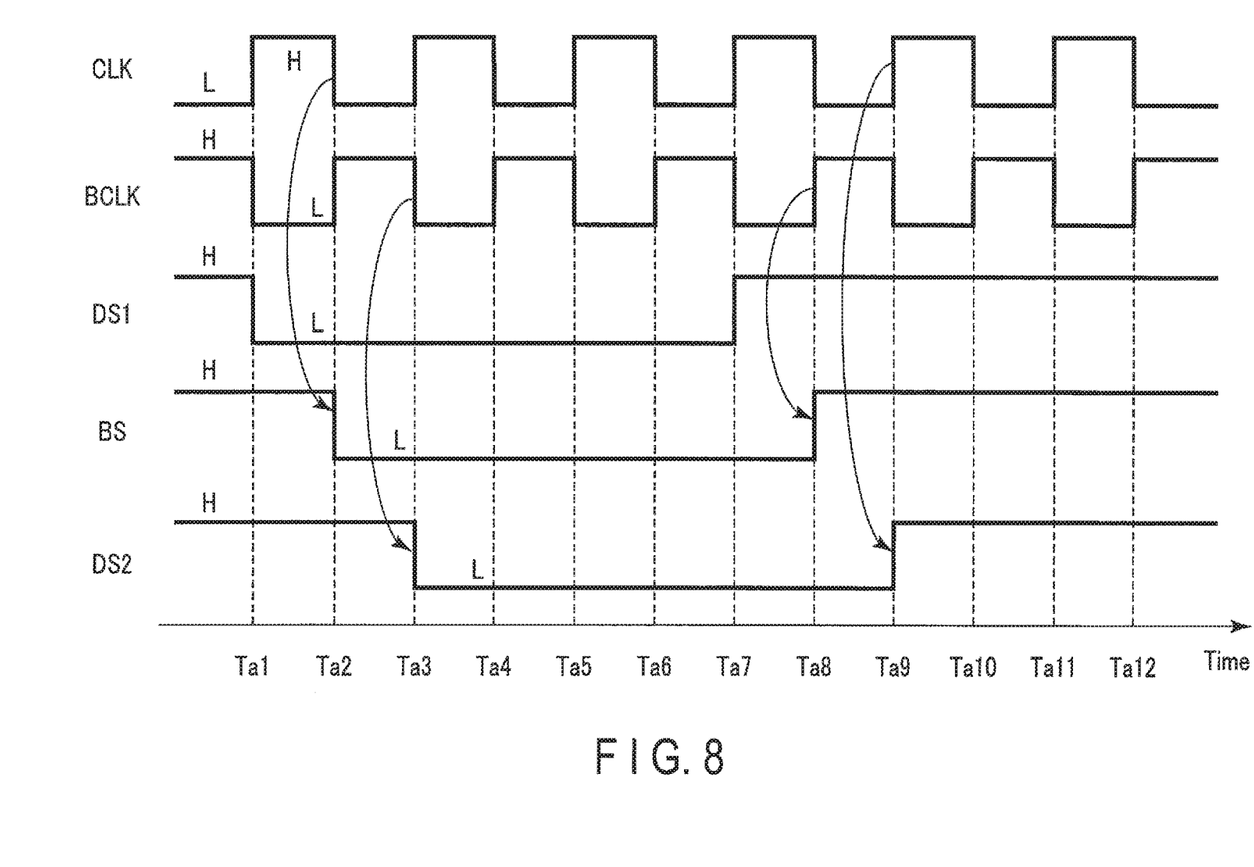
FIG. 8 is a waveform diagram illustrating an operation of the second flip-flop of the frequency divider circuit according to the embodiment.

FIG. 8 illustrates waveforms of the clock signal CLK, inverted clock signal BCLK, second input terminal D, first output terminal H, and second output terminal Q.

In this example, the potential of the second input terminal D changes at an every third rising edge of the clock signal CLK.

[Time Instant Ta1]

At a timing of a rising edge of the clock signal CLK, or at a timing of a falling edge of the inverted clock signal BCLK, the potential of the second input terminal D is inverted and input to the node N6 by the first clocked inverter CKINV1.

At time instant Ta1, since the potential of the second input terminal D falls to "L" level, the first clocked inverter CKINV1 charges the node N6, based on the fall of the inverted clock signal BCLK. Furthermore, the third inverter INV3 discharges the node N7, based on the potential of the node N6. At this time point, the node N6 is not sufficiently charged, and, similarly, the node N7 is not sufficiently discharged.

[Time Instant Ta2]

At a timing of a falling edge of the clock signal CLK, or at a timing of a rising edge of the inverted clock signal BCLK, the potentials of the node N6 and node N7 are determined by the second clocked inverter CKINV2.

At time instant Ta2, since the node N7 is discharged, the second clocked inverter CKINV2 charges the node N6, based on the fall of the clock signal CLK. As described above, since the first clocked inverter CKINV1 also charges the node N6, the potential of the node N6 rises to "H" level. Furthermore, since the third inverter INV3 discharges the node N7, based on the potential of the node N6, the potential of the node N7 falls to "L" level. Specifically, at this timing, the potential of the first output terminal H becomes "L" level.

In addition, the potential of the node N7 is inverted and input to the node N8 by the third clocked inverter CKINV3.

At time instant Ta2, since the potential of the node N7 becomes "L" level, the third clocked inverter CKINV3 charges the node N8, based on the fall of the clock signal CLK. Furthermore, based on the potential of the node N8, the fourth inverter INV4 discharges the node N9. At this time point, the node N8 is not sufficiently charged, and, similarly, the node N9 is not sufficiently discharged.

[Time Instant Ta3]

At a timing of a rising edge of the clock signal CLK, or at a timing of a falling edge of the inverted clock signal BCLK, the potentials of the node N8 and node N9 are determined by the fourth clocked inverter CKINV4. Specifically, at this timing, the potential of the second output terminal Q changes.

At time instant Ta3, since the node N9 is discharged, the fourth clocked inverter CKINV4 charges the node N8, based on the fall of the inverted clock signal BCLK. As described above, since the third clocked inverter CKINV3 also charges the node N8, the potential of the node N8 rises to "H" level. Furthermore, since the fourth inverter INV4 discharges the node N9, based on the potential of the node N8, the potential of the node N9 falls to "L" level. Specifically, at this timing, the potential of the second output terminal Q becomes "L" level.

[Time Instant Ta7]

At time instant Ta7, since the potential of the second input terminal D rises to "H" level, the first clocked inverter CKINV1 discharges the node N6, based on the rise of the clock signal CLK. Furthermore, based on the potential of the node N6, the third inverter INV3 charges the node N7. At this time point, the node N6 is not sufficiently discharged, and, similarly, the node N7 is not sufficiently charged.

[Time Instant Ta8]

At time instant Ta8, since the node N7 is charged, the second clocked inverter CKINV2 discharges the node N6, based on the rise of the inverted clock signal BCLK. As described above, since the first clocked inverter CKINV1 also discharges the node N6, the potential of the node N6 falls to "L" level. Furthermore, since the third inverter INV3 charges the node N7, based on the potential of the node N6, the potential of the node N7 rises to "H" level. Specifically, at this timing, the potential of the first output terminal H becomes "H" level.

At time instant Ta8, since the potential of the node N7 becomes "H" level, the third clocked inverter CKINV3 discharges the node N8, based on the rise of the inverted clock signal BCLK. Furthermore, based on the potential of the node N8, the fourth inverter INV4 charges the node N9. At this time point, the node N8 is not sufficiently discharged, and, similarly, the node N9 is not sufficiently charged.

[Time Instant Ta9]

At time instant Ta9, since the node N9 is charged, the fourth clocked inverter CKINV4 discharges the node N8, based on the rise of the clock signal CLK. As described above, since the third clocked inverter CKINV3 also discharges the node N8, the potential of the node N8 falls to "L" level. Furthermore, since the fourth inverter INV4 charges the node N9, based on the potential of the node N8, the potential of the node N9 rises to "H" level. Specifically, at this timing, the potential of the second output terminal Q becomes "H" level.

As illustrated in FIG. 8, the rise of the clock signal CLK and the fall of the inverted clock signal BCLK are substantially coincident. In addition, the fall of the clock signal CLK and the rise of the inverted clock signal BCLK are substantially coincident. Thus, for the purpose of simplicity, the description will be given, with attention paid to the clock signal CLK, and not to the inverted clock signal BCLK.

As described above, in the second flip-flop DEFH2, at the fall of the first clock after the change of the potential of the input signal terminal D, the potential of the first output terminal H changes. In addition, at the rise of the second clock after the change of the potential of the input signal terminal D, the potential of the second output terminal Q changes.

In the meantime, the operations of the first flip-flop DEF1 and third flip-flop DEF3 are substantially the same as the operation of the second flip-flop DEFH2. The first flip-flop DEF1 and third flip-flop DEF3 are different from the second flip-flop DEFH2 in that neither the first flip-flop DEF1 nor the third flip-flop DEF3 outputs data from the node N7. Specifically, in the first flip-flop DEF1 and third flip-flop DEF3, the potential of the output terminal Q changes at the rise of the second clock after the change of the potential of the input signal terminal D.

<1-2-2> Operation of Frequency Divider Circuit 108

Next, referring to FIG. 9, the operation of the frequency divider circuit 108 will be described.

Figure 9:
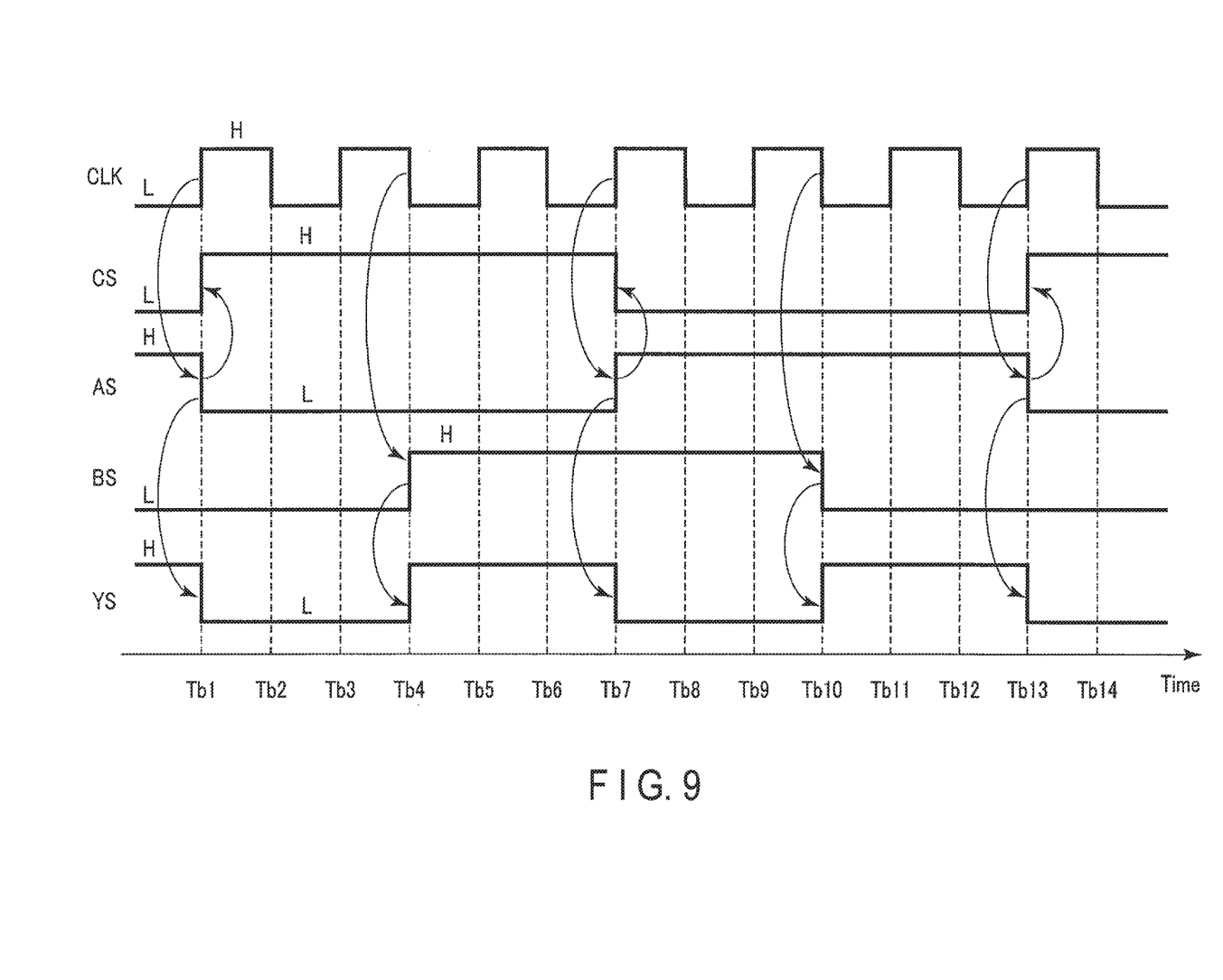
FIG. 9 is a waveform diagram illustrating an operation of the frequency divider circuit according to the embodiment.

FIG. 9 illustrates waveforms of the clock signal CLK, and signals CS, AS, BS and YS.

In the present example, a description will be given of the case in which the signal AS falls from "H" level to "L" level at time instant Tb1.

[Time Instant Tb1]~[Time Instant Tb2]

At a timing of the rise of the clock signal CLK, the third flip-flop DEF3 outputs a signal of "L" level. When the signal AS falls from "H" level to "L" level, the inverter INV1 raises the signal CS from "L" level to "H" level. In addition, since both the signals AS and BS become "L" level, the exclusive OR gate XOR1 outputs a signal YS of "L" level.

Furthermore, the signal CS of "H" level is stored in the first flip-flop DEF1.

[Time Instant Tb3]~[Time Instant Tb4]

At a timing of the rise of the clock signal CLK, a signal DS1 of "H" level is output from the first flip-flop DEF1, and the signal DS1 of "H" level is stored in the second flip-flop DEFH2.

In addition, at a timing of the fall of the clock signal CLK at time instant Tb4, the second flip-flop DEFH2 outputs a signal BS of "H" level.

Thereby, since the signal AS becomes "L" level and the signal BS becomes "H" level, the exclusive OR gate XOR1 outputs a signal YS of "H" level.

[Time Instant Tb5]~[Time Instant Tb6]

At a timing of the rise of the clock signal CLK, a signal DS2 of "H" level is output from the second flip-flop DEF2, and the signal DS2 of "H" level is stored in the third flip-flop DEFH3.

[Time Instant Tb7]~[Time Instant Tb8]

At a timing of the rise of the clock signal CLK, the third flip-flop DEF3 outputs a signal of "H" level. If the signal AS rises from "L" level to "H" level, the inverter INV1 lowers the signal CS from "H" level to "L" level. In addition, since both the signals AS and BS become "H level, the exclusive OR gate XOR1 outputs a signal YS of "L" level.

Furthermore, a signal CS of "L" level is stored in the first flip-flop DEF1.

[Time Instant Tb9]~[Time Instant Tb10]

At a timing of the rise of the clock signal CLK, a signal DS1 of "L" level is output from the first flip-flop DEF1, and the signal DS1 of "L" level is stored in the second flip-flop DEFH2.

In addition, at a timing of the fall of the clock signal CLK at time instant Tb10, the second flip-flop DEFH2 outputs a signal BS of "L" level.

Thereby, since the signal AS becomes "H" level and the signal BS becomes "L" level, the exclusive OR gate XOR1 outputs a signal YS of "H" level.

[Time Instant Tb11]~[Time Instant Tb12]

At a timing of the rise of the clock signal CLK, a signal DS2 of "L" level is output from the second flip-flop DEF2, and the signal DS2 of "L" level is stored in the third flip-flop DEF3.

[Time Instant Tb13]~[Time Instant Tb14]

The frequency divider circuit 108 operates in the same manner as described in connection with time instant Tb1 to time instant Tb2.

As described above, each time the clock signal CLK rises, signals are transmitted successively to the first flip-flop DEF1, second flip-flop DEFH2 and third flip-flop DEF3 in the named order. Thus, at the fall of every third clock signal CLK, the level of the signal AS is inverted.

In addition, at the fall of every third clock signal CLK, the level of the signal BS is inverted.

The phase of the output timing of the first output terminal H of the second flip-flop DEFH2 and the phase of the output timing of the second output terminal Q of the second flip-flop DEFH2 are shifted by 1.5 cycles of the clock signal CLK.

Thus, a signal YS, which corresponds to three times the cycle of the clock signal CLK, can be obtained as the exclusive OR between the signal AS and the signal BS.

<1-3> Advantageous Effects

According to the above-described embodiment, in the frequency divider circuit of an odd-number multiple, a half-latch-equipped D-flip-flop is provided between two D-flop-flops.

According to this frequency divider circuit, the phase of the half-latch output of the half-latch-equipped D-flip-flop is shifted by a ¼ cycle of the frequency-divided clock. In addition, a frequency-divided clock of an odd-number multiple can be generated by taking an exclusive OR between the frequency-divided clock and the clock of the half-latch output.

Here, in order to explain the advantageous effects of the embodiment, a comparative example will be described.

Figure 10:
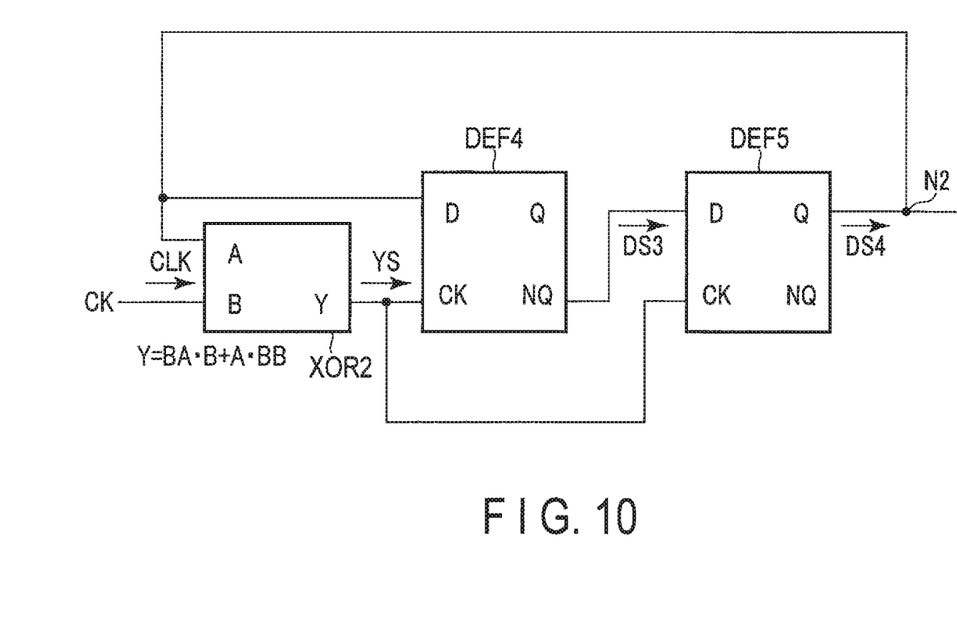
FIG. 10 is a block diagram illustrating a frequency divider circuit according to a comparative example of the embodiment.
Figure 11:
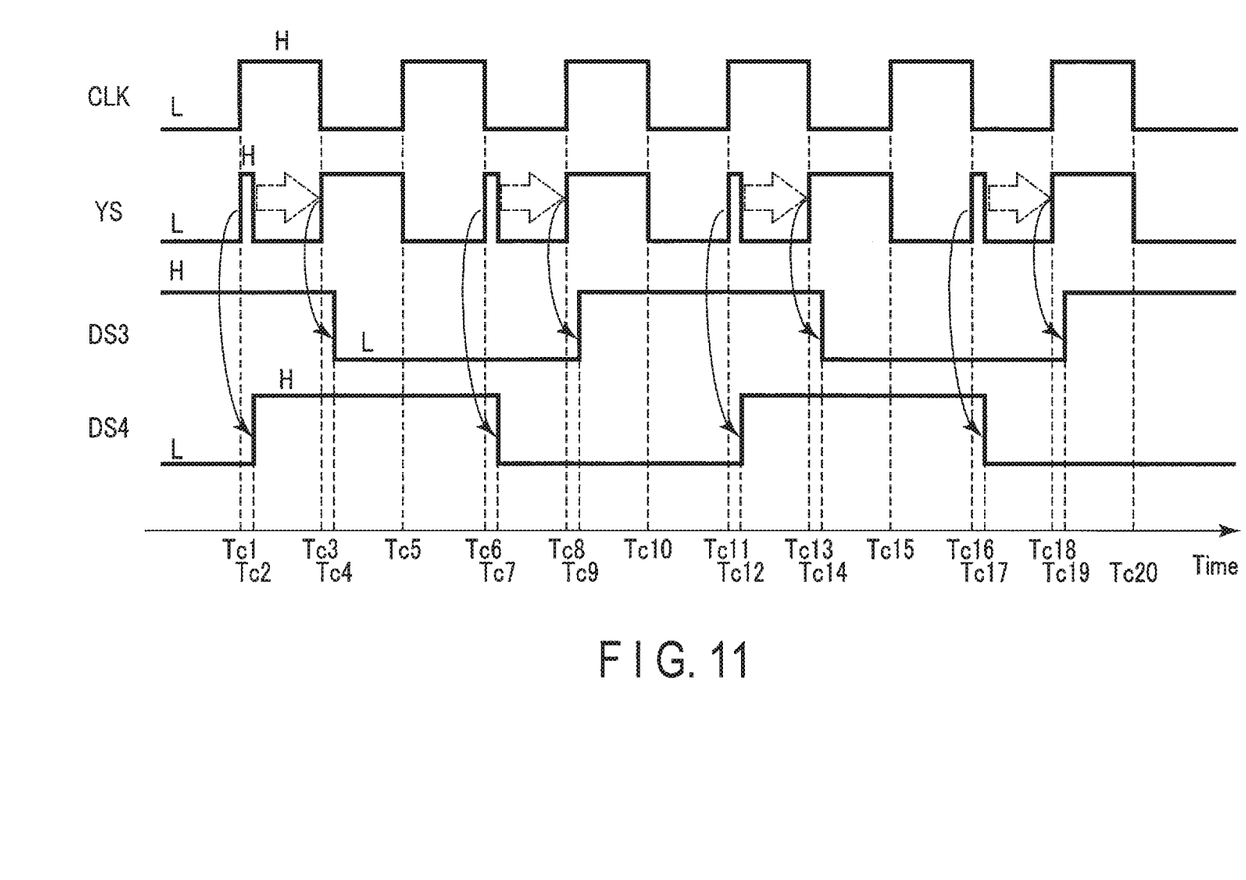
FIG. 11 is a waveform diagram illustrating an operation of the frequency divider circuit according to the comparative example of the embodiment.

As illustrated in FIG. 10 and FIG. 11, in a frequency divider circuit according to the comparative example, by taking an exclusive OR between a reference clock CLK and a frequency-divided clock, 4 clock edges are generated while 3 clock edges of the reference clock are being input. Thereby, ⅓ frequency division is realized.

However, in the comparative example, as illustrated in FIG. 11, two clock edges are generated in one reference clock cycle. Thus, as indicated by an arrow in FIG. 11, if the reference clock operates at high speed, a rising period of the signal YS becomes longer, and there arises a problem that the operation cannot be finished within one cycle.

In the frequency divider circuit according to the above-described embodiment, at the rising edge of every third reference clock CLK, the first flip-flop DEF1, second flip-flop DEFH2 and third flip-flop DEF3 operate, and thereby the signal AS is inverted.

In the half-latch portion of the second flip-flop DEFH2, the data changes at the falling edge of every third reference clock CLK. The phase of the output of the half-latch portion of the second flip-flop DEFH2 and the phase of the third flip-flop DEF3 are shifted by just 1.5 cycles of the reference clock CLK. Thus, a signal YS, which corresponds to three times the cycle of the clock signal CLK, can be obtained as the exclusive OR between the signal BS and the signal AS.

In this manner, in the frequency divider circuit according to the above-described embodiment, unlike the frequency divider circuit according to the comparative example, the signal YS is generated from the signal AS and signal BS each having a longer cycle than the reference clock CLK. Therefore, even if the reference clock CLK operates at high speed, proper frequency division can be executed.

<2> Modifications

In the meantime, also when the number of D-flip-flops is 2N (N is an integer) and the number of half-latch-equipped D-flip-flops is one, a signal YS with a duty cycle of 50% can be obtained by interposing the half-latch-equipped D-flip-flop between an N number of D-flip-flops and an N number of D-flip-flops. To be more specific, the above-described frequency divider circuit may include a first flip-flip group in which an N (N is an integer) number of D-flip-flops each having a first input terminal to which a clock signal is input are connected in series; a second flip-flip group in which an N number of D-flip-flops each having a first input terminal to which the clock signal is input are connected in series; and a half-latch-equipped D-flip-flop which has a first input terminal to which the clock signal is input, and which is disposed between the first flip-flop group and the second flip-flop group.

In addition, in each of the embodiments, (1) in the read operation, the voltage applied to a word line selected in the read operation of A level is, for example, 0 V to 0.55 V. However, the voltage is not limited to this and may be 0.1 V to 0.24 V, 0.21 V to 0.31 V, 0.31 V to 0.4 V, 0.4 V to 0.5 V, or 0.5 V to 0.55 V.

The voltage applied to a word line selected in the read operation of B level is, for example, 1.5 V to 2.3 V. However, the voltage is not limited to this and may be 1.65 V to 1.8 V, 1.8 V to 1.95 V, 1.95 V to 2.1 V, or 2.1 V to 2.3 V.

The voltage applied to a word line selected in the read operation of C level is, for example, 3.0 V to 4.0 V. However, the voltage is not limited to this and may be 3.0 V to 3.2 V, 3.2 V to 3.4 V, 3.4 V to 3.5 V, 3.5 V to 3.6 V, or 3.6 V to 4.0 V.

The time (tR) of the read operation can be, for example, 25 μs to 38 μs, 38 μs to 70 μs, or 70 μs to 80 μs.

(2) The write operation includes a program operation and a verify operation, as described above. In the write operation, the voltage first applied to a word line selected at the time of program operation is, for example, 13.7 V to 14.3 V. However, the voltage is not limited to this and may be, for example, 13.7 V to 14.0 V, or 14.0 V to 14.6 V.

The voltage first applied to a selected word line when writing to an odd-numbered word line and the voltage first applied to a selected word line when writing to an even-numbered word line may be different.

When the program operation is performed by the ISPP method (Incremental Step Pulse Program), the step-up voltage is, for example, 0.5 V.

The voltage applied to a non-selected word line can be, for example, 6.0 V to 7.3 V. However, the voltage is not limited to this and may be, for example, 7.3 V to 8.4 V, or 6.0 V or less.

The pass voltage to be applied may be changed depending on whether the non-selected word line is an odd-numbered word line or an even-numbered word line.

The time (tProg) of the write operation can be, for example, 1700 μs to 1800 μs, 1800 μs to 1900 μs, or 1900 μs to 2000 μs.

(3) In the erase operation, the voltage first applied to a well formed in the upper portion of a semiconductor substrate and having the memory cell arranged above is, for example, 12 V to 13.6 V. However, the voltage is not limited to this and may be, for example, 13.6 V to 14.8 V, 14.8 V to 19.0 V, 19.0 V to 19.8 V, or 19.8 V to 21 V.

The time (tErase) of the erase operation can be, for example, 3000 μs to 4000 μs, 4000 μs to 5000 μs, or 4000 μs to 9000 μs.

(4) The configuration of the memory cell includes:

a charge accumulation layer arranged on a 4 to 10 nm thick tunnel insulating film on a semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 nm to 70 nm thick control electrode is formed on a 3 to 10 nm thick material on the insulating film, the material being used to adjust the work function. Here, the material used to adjust the work function is a metal oxide film such as TaO, or a metal nitride film such as TaN. W or the like can be used for the control electrode.

Besides, an air gap can be formed between the memory cells.

In addition, in each embodiment of the present invention, (1) in the read operation, the voltage applied to a word line selected in the read operation of A level is, for example, 0 V to 0.55 V. However, the voltage is not limited to this and may be 0.1 V to 0.24 V, 0.21 V to 0.31 V, 0.31 V to 0.4 V, 0.4 V to 0.5 V, or 0.5 V to 0.55 V.

The voltage applied to a word line selected in the read operation of B level is, for example, 1.5 V to 2.3 V. However, the voltage is not limited to this and may be 1.65 V to 1.8 V, 1.8 V to 1.95 V, 1.95 V to 2.1 V, or 2.1 V to 2.3 V.

The voltage applied to a word line selected in the read operation of C level is, for example, 3.0 V to 4.0 V. However, the voltage is not limited to this and may be 3.0 V to 3.2 V, 3.2 V to 3.4 V, 3.4 V to 3.5 V, 3.5 V to 3.6 V, or 3.6 V to 4.0 V.

The time (tR) of the read operation can be, for example, 25 μs to 38 μs, 38 μs to 70 μs, or 70 μs to 80 μs.

(2) The write operation includes a program operation and a verify operation, as described above. In the write operation, the voltage first applied to a word line selected at the time of program operation is, for example, 13.7 V to 14.3 V. However, the voltage is not limited to this and may be, for example, 13.7 V to 14.0 V, or 14.0 V to 14.6 V.

The voltage first applied to a selected word line when writing to an odd-numbered word line and the voltage first applied to a selected word line when writing to an even-numbered word line may be different.

When the program operation is performed by the ISPP method (Incremental Step Pulse Program), the step-up voltage is, for example, 0.5 V.

The voltage applied to a non-selected word line can be, for example, 6.0 v to 7.3 V. However, the voltage is not limited to this and may be, for example, 7.3 V to 8.4 V, or 6.0 V or less.

The pass voltage to be applied may be changed depending on whether the non-selected word line is an odd-numbered word line or an even-numbered word line.

The time (tProg) of the write operation can be, for example, 1700 μs to 1800 μs, 1800 μs to 1900 μs, or 1900 μs to 2000 μs.

(3) In the Erase Operation, the voltage first applied to a well formed in the upper portion of a semiconductor substrate and having the memory cell arranged above is, for example, 12 V to 13.6 V. However, the voltage is not limited to this and may be, for example, 13.6 V to 14.8 V, 14.8 V to 19.0 V, 19.0 V to 19.8 V, or 19.8 V to 21 V.

The time (tErase) of the erase operation can be, for example, 3000 μs to 4000 μs, 4000 μs to 5000 μs, or 4000 μs to 9000 μs.

(4) The configuration of the memory cell includes:

a charge accumulation layer arranged on a 4 to 10 nm thick tunnel insulating film on a semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 nm to 70 nm thick control electrode is formed on a 3 to 10 nm thick material on the insulating film. A material used to adjust the work function is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A frequency divider circuit comprising:
a first flip-flop including a first input terminal to which a clock signal is input, and including a second input terminal to which a first signal is input;
a second flip-flop including a first input terminal to which the clock signal is input, and including a second input terminal to which a second signal is input, the second signal being output from the first flip-flop;
a third flip-flop including a first input terminal to which the clock signal is input, and including a second input terminal to which a third signal is input, the third signal being output from the second flip-flop;
an inverter configured to generate the first signal, based on a fourth signal which is output from the third flip-flop; and
an exclusive OR gate including a first input terminal to which the fourth signal is input, and including a second input terminal to which a fifth signal is input, the fifth signal being output from the second flip-flop.

2. The frequency divider circuit of claim 1, wherein the second flip-flop is configured to change the third signal at a timing of a rise of the clock signal, and configured to change the fifth signal at a timing of a fall of the clock signal.

3. The frequency divider circuit of claim 1, wherein a level of the fifth signal is inverted at every third fall of the clock signal.

4. The frequency divider circuit of claim 1, wherein the first flip-flop is configured to change the second signal at a timing of a rise of the clock signal, and the third flip-flop is configured to change the fourth signal at a timing of a rise of the clock signal.

5. The frequency divider circuit of claim 1, wherein levels of the second signal, the third signal and the fourth signal are inverted at every third rise of the clock signal.

6. The frequency divider circuit of claim 1, wherein the exclusive OR gate is configured to execute an exclusive OR arithmetic operation with respect to the fourth signal and the fifth signal, and configured to output a sixth signal as a result of the exclusive OR arithmetic operation.

7. The frequency divider circuit of claim 6, wherein the sixth signal has a cycle which is three times greater than a cycle of the clock signal.

8. The frequency divider circuit of claim 1, wherein a phase of the fifth signal and a phase of the fourth signal are shifted by 1.5 cycles of the clock signal.

9. The frequency divider circuit of claim 1, wherein the inverter is configured to generate the first signal by inverting the fourth signal.

10. A frequency divider circuit comprising:
a first flip-flop group in which an N (N is an integer) number of flip-flops each having a first input terminal to which a clock signal is input are connected in series;
a second flip-flop group in which an N number of flip-flops each having a first input terminal to which the clock signal is input are connected in series;
a third flip-flop including a first input terminal to which the clock signal is input, the third flip-flop being disposed between the first flip-flop group and the second flip-flop group;
an inverter configured to generate, based on a first signal which is output from the flip-flop provided at an end portion of the second flip-flop group, a second signal which is supplied to the flip-flop provided at an end portion of the first flip-flop group; and
an exclusive OR gate including a first input terminal to which the first signal is input, and including a second input terminal to which a third signal is input, the third signal being output from the third flip-flop.

11. The frequency divider circuit of claim 10, wherein the third flip-flop is configured to change the third signal at a timing of a fall of the clock signal.

12. The frequency divider circuit of claim 10, wherein a level of the third signal is inverted at every (2N+1)th fall of the clock signal.

13. The frequency divider circuit of claim 10, wherein the first flip-flop group and the second flip-flop group are configured to change output signals at a timing of a rise of the clock signal.

14. The frequency divider circuit of claim 10, wherein a level of the first signal is inverted at every (2N+1)th rise of the clock signal.

15. The frequency divider circuit of claim 10, wherein the exclusive OR gate is configured to execute an exclusive OR arithmetic operation with respect to the first signal and the third signal, and configured to output a fourth signal as a result of the exclusive OR arithmetic operation.

16. The frequency divider circuit of claim 15, wherein the fourth signal has a cycle which is 2N+1 times greater than a cycle of the clock signal.

17. The frequency divider circuit of claim 10, wherein a phase of the third signal and a phase of the first signal are shifted by (2N+1)/2 cycles of the clock signal.

18. The frequency divider circuit of claim 10, wherein the inverter is configured to generate the second signal by inverting the first signal.

\* \* \* \* \*